United States Patent [19]

Lilja

[11] Patent Number: 5,625,203
[45] Date of Patent: Apr. 29, 1997

[54] CONTROLLED TURN-OFF POWER SEMICONDUCTOR DEVICE

[75] Inventor: Klas Lilja, Fislisbach, Switzerland

[73] Assignee: Asea Brown Boveri Ltd., Baden, Switzerland

[21] Appl. No.: 451,994

[22] Filed: May 26, 1995

Related U.S. Application Data

[63] Continuation of Ser. No. 158,495, Nov. 29, 1993, abandoned, which is a continuation of Ser. No. 795,375, Nov. 21, 1991, abandoned.

[30] Foreign Application Priority Data

Nov. 29, 1990 [CH] Switzerland ............... 3783/90

[51] Int. Cl.$^6$ ............... H01L 29/74; H01L 29/78
[52] U.S. Cl. ............... 257/132; 257/133; 257/138; 257/146
[58] Field of Search ............... 257/132, 133, 257/146, 138

[56] References Cited

U.S. PATENT DOCUMENTS 4,581,543  4/1986  Herberg ............... 257/133
4,914,496  4/1990  Nakagawa et al. ............... 257/138

FOREIGN PATENT DOCUMENTS 0106059  4/1984  European Pat. Off. .

OTHER PUBLICATIONS

Proceedings of PESC, 398–406 pp., Jun. 11–Jun. 14, 1990, IEEE, San Antonio, TX, K. Lijia, et al., "Onset of Current Filimentation in GTO Devices".

IEEE Transaction on Electron Devices, vol. ED-33, No. 10, 1609–1618 pp., Oct. 1986, IEE, New York, NY, US, V.A.K. Temple, "MOS–Controlled Thyristors—A New Class of Power Devices".

Primary Examiner—Donald L. Monin, Jr.
Attorney, Agent, or Firm—Oblon, Spivak, McClelland, Maier & Neustadt, P.C.

[57] ABSTRACT

A controlled turn-off power semiconductor device is proposed which is subdivided into unit cells and which comprises five layers in a p-n-p-n-p sequence, namely a p-type emitter layer (9), an n-type base layer (8), a p-type base layer (7), an n-type emitter layer (6) and a p-doped contact region (5) between an anode (a) and a cathode (K). In every unit cell a first MOSFET (M1) which can be driven via a first insulated gate (G1) is provided on the cathode side for switching between the five-layer structure and a conventional thyristor four-layer structure. Further, a breakdown between the contact region (5) and the n-type emitter layer (6) is prevented during turning-off. As a result of the switchable five-layer structure, a current filamentation is effectively avoided during turning-off.

14 Claims, 3 Drawing Sheets

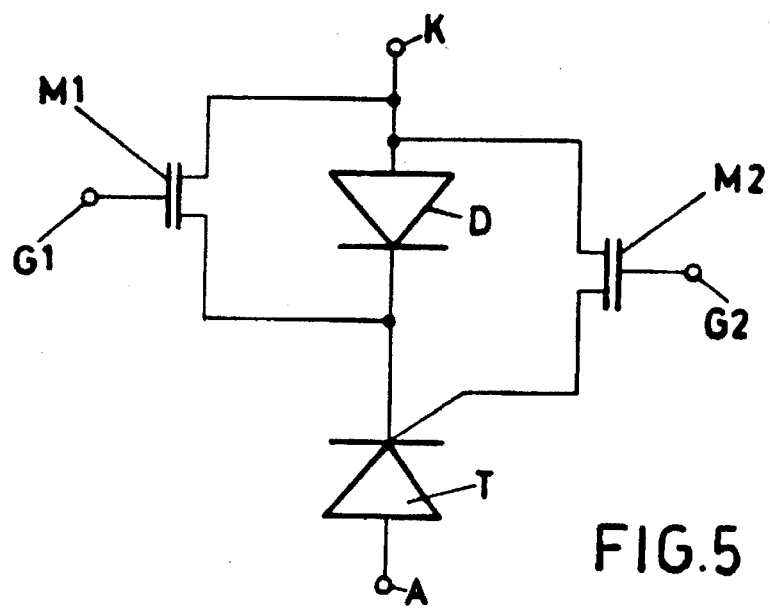
FIG.5
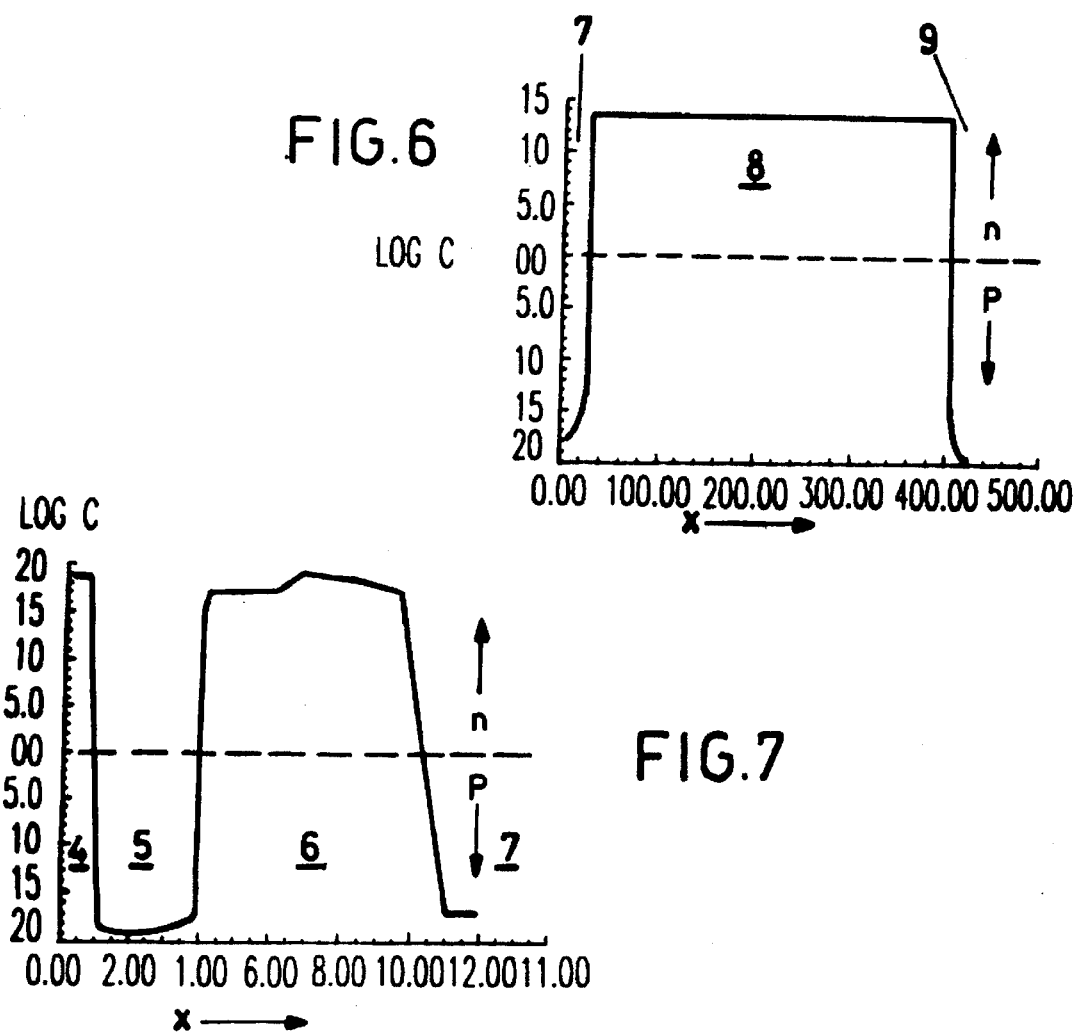
FIG.6
FIG.7

CONTROLLED TURN-OFF POWER SEMICONDUCTOR DEVICE

This application is a Continuation of application Ser. No. 08/158,495, filed on Nov. 29, 1993, now abandoned, which is a Continuation of application Ser. No. 07/795,375, filed on Nov. 21, 1991, now abandoned.

BACKGROUND OF THE INVENTION

1. Field of the Invention

The present invention relates to the field of power electronics. It relates, in particular, to a controlled turn-off power semiconductor device, comprising (a) a multiplicity of adjacently arranged, electrically parallel-connected unit cells in a semiconductor substrate between an anode and a cathode;

(b) a layer sequence of a plurality of successive layers doped with alternating polarity within each unit cell between the anode and the cathode; and (c) within each unit cell, a first MOSFET which is arranged on the cathode side and which is provided for turning off the device.

Such a device is disclosed, for example, by a paper by V. A. K. Temple, IEEE Transactions on Electron Devices, vol. ED-33, No. 10, October 1986, pages 1609–1618 as a MOS controlled thyristor (MCT).

2. Discussion of Background

Modern power electronics at present require fast semiconductor devices which can be driven with simple means and which can be used up to the maximum power ranges.

Controllable semiconductor devices for maximum powers are at present the GTO (gate-turn-off) thyristors. In principle, the entire chip area in the GTO is subdivided into a multiplicity of parallel-connected elementary cells. These devices can be turned on and off by means of the gate contact; because of the high gate currents during turning-off, however, an enormous switching complexity has to be accepted in this connection for the gate drive.

For some years, the development of MOS-controlled devices has been increasingly promoted in power electronics. The advantage of said MOS-controlled devices is based chiefly on the high input impedance at the control electrode. It makes it possible to drive the device with a comparatively very low power consumption.

This trend was initiated by the unipolar power MOSFETs with DMOS structure. Said DMOSFETs have, however, a serious disadvantage: because of the unipolar conduction nature, high breakdown voltages have to be paid for in these devices with high forward resistances which limit the maximum current level.

Higher switchable powers are known to be achievable only with bipolar structures (for example, thyristors). Nevertheless, in such bipolar structures the simple and, in particular, low-power control used in the power MOSFETs should if possible be retained.

It has therefore been proposed to realize the concept described for controlling power semiconductor devices via MOS gates even in devices of the highest power class, namely in thyristors (in this connection see the paper by V. A. K. Temple) mentioned in the introduction.

In such an MOS-controlled thyristor or MCT (MOS Controlled Thyristor) which, like the GTO, comprises a multiplicity of adjacently situated, parallel-connected unit cells, the turning-off is achieved by short-circuiting the emitter to the p-type base through switchable emitter shorts. In this case, MOSFETs which are integrated with the emitter and which may naturally optionally be designed as n- or p-channel MOSFETs are used as switches.

In finely structured thyristors of the MCT or GTO type, however, extremely inhomogeneous current density distributions (filaments) may occur during turning-off (in this connection see K. Lilja and H. Grüning, "Onset of Current Filamentation in GTO Devices", PESC '90, Power Electronics Specialist Conference, pages 398–406 (1990)). In this connection, a small voltage increase in the p-type base layer results in an exponential growth in the electron injection from the cathode. Under normal conditions, this inevitably results in a redistribution and a filamentation of the current, which may destroy the device.

SUMMARY OF THE INVENTION

The object of the invention is therefore to provide a bipolar power semiconductor device which can be controlled by an insulated gate and which is capable of switching maximum powers without filamentation effects.

The object is achieved in a device of the type mentioned in the introduction, wherein (d) the layer sequence comprises at least five layers, of which the first layer is formed as a $p^+$-doped p-type emitter layer, the second layer as an $n^-$-doped n-type base layer, the third layer as a $p^+$-doped p-type base layer, the fourth layer as an $n^+$-doped n-type emitter layer and the fifth layer as a $p^+$-doped contact region;

(e) the p-type emitter layer is arranged on the anode side and is contacted by an anode contact, and the contact region is arranged on the cathode side and is contacted by a cathode contact;

(f) the first MOSFET produces a switchable connection between the n-type emitter layer and the cathode contact and is formed from the n-type emitter layer, the contact region, an $n^+$-doped source region connected to the cathode contact and a first gate electrode arranged in an insulated fashion above the contact region; and (g) means are furthermore provided by which a conducting connection can be produced between the contact region and the p-type base layer during turning-off.

The essence of the invention is now to provide a five-layer structure between the anode and the cathode instead of the standard bipolar p-n-p-n thyristor structure composed of four layers, a $p^+$-doped contact region directly connected to the cathode being arranged as fifth layer on the cathode side.

In the on-state mode, the contact region is shunted by a MOSFET. During turning-off, on the other hand, this additional layer is between the cathode and the p-n-p-n thyristor structure and effectively prevents the electron injection which results in filamentation.

According to a first preferred embodiment of the invention, the means comprise a second MOSFET which is formed from the contact region, the n-type emitter layer, the p-type base layer and a second gate electrode arranged above the n-type emitter layer.

Turning-on said second MOSFET during turning-off removes the holes injected by the anode and consequently effectively prevents an avalanche breakdown between the contact region and the n-type emitter layer.

A further preferred embodiment is distinguished by the fact that (a) the means comprise a parasitic bipolar transistor which is formed from the fifth layer, the n-type emitter layer and the p-type base layer;

(b) the n-type emitter layer taking on the function of the base of the bipolar transistor; and (c) the bipolar transistor being turned on by an avalanche breakdown between the contact region and the n-type emitter layer during turning-off.

In this embodiment, the bipolar transistor, which is turned on automatically during turning-off, takes on the function of the second MOSFET.

Further embodiments emerge from the subordinate claims.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 2 shows the cross section of the unit cell of a device according to a second preferred embodiment of the device according to the invention containing three MOSFETs, the third of which is used for turning-on;

FIG. 5 shows the equivalent circuit diagram of a device according to FIG. 1;

FIG. 6 shows the variation in an exemplary doping profile along the section B—B in FIG. 1; and FIG. 7 shows the variation in an exemplary doping profile along the section A—A in FIG. 1.

DESCRIPTION OF THE PREFERRED EMBODIMENTS

Figure 1:
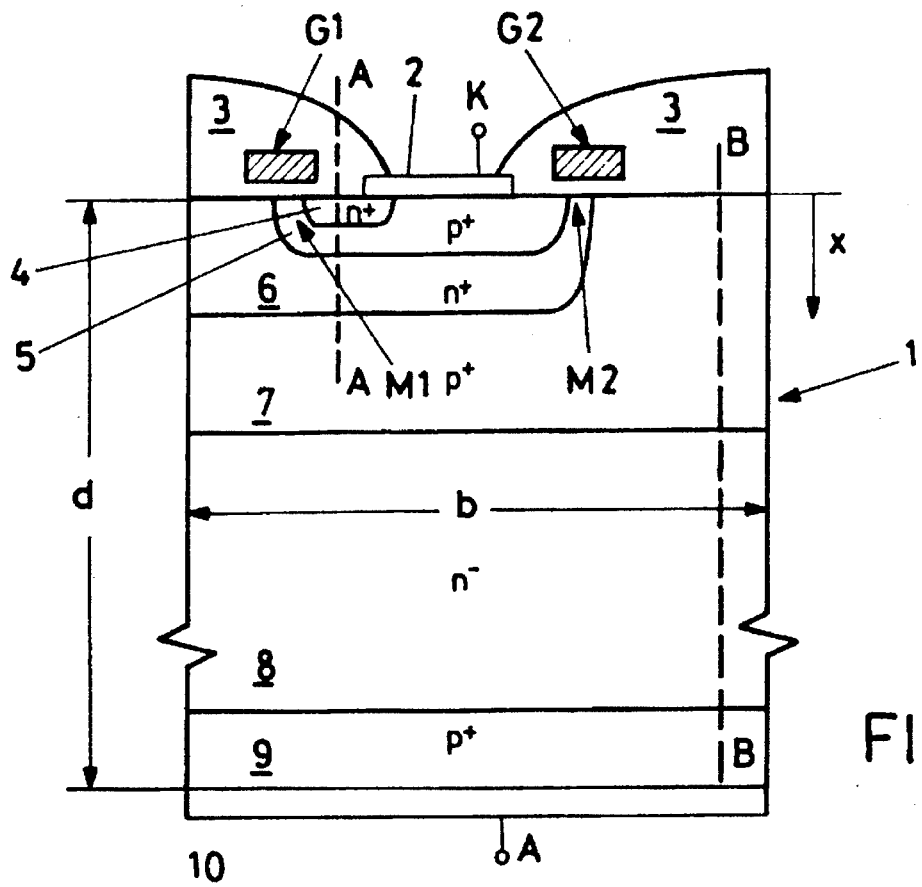
FIG. 1 shows the cross section of the unit cell of a device according to a first preferred embodiment of the device according to the invention containing two MOSFETs.

Referring now to the drawings, wherein like reference numerals designate identical or corresponding parts throughout the several views, FIG. 1 shows the cross section of the unit cell of a preferred embodiment of the device according to the invention. The device is generally an insulated-gate-controlled bipolar switch comprising five layers and is therefore to be denoted below as IG-FiBS ( Insulated Gate controlled Five layer Bipolar Switch) for short.

In the embodiment shown, the IG-FiBS is composed of a semiconductor substrate 1 with an upper and a lower principle face. The lower principle face is provided with an anode contact 10 which is connected to the anode A. The upper principle face carries, within each unit cell, a cathode contact 2 which is in turn connected to the cathode K.

Arranged between the anode contact 10 and the cathode contact 2 inside the semiconductor substrate 1 is a layer sequence of five layers doped with alternating polarity which comprises consecutively a p$^+$-doped p-type emitter layer 9, an n$^-$-doped n-type base layer 8, a p$^+$-doped p-type base layer 7, an n$^+$-doped n-type emitter layer 6 and a p$^+$-doped contact region 5. The p-type emitter layer 9 is at the same time contacted by the anode contact 10, and the contact region 5 on the other side of the semiconductor substrate by the cathode contact 2.

At the side of the cathode contact 2, there is integrated into the semiconductor substrate 1, on one side, a first MOSFET M1 and, on the other side, a second MOSFET M2.

The first MOSFET M1 is formed from the n-type emitter layer 6, the contact region 5, an n$^+$-doped source region 4 embedded in the contact region 5 and connected to the cathode contact 2, and a first gate electrode G1 arranged in an insulated fashion (gate insulation 3) above the contact region 5. It is an n-channel MOSFET whose channel region is part of the contact region 5 emerging at the upper principle face between n-type emitter layer 6 and source region 4.

The second MOSFET M2 is formed from the p-type base layer 7, the n-type emitter layer 6, the contact region 5 and a second gate electrode G2 arranged in an insulated fashion (gate insulation 3) above the n-type emitter layer 6. It is a p-channel MOSFET whose channel region is part of the n-type emitter layer 6 emerging at the upper principle face between the tub-shaped contact region 5 and the p-type base layer 7.

The parameters of the unit cell of the embodiment from FIG. 1 may be chosen, for example, as follows: the unit cell has a width b of about 20 μm. The thickness d of the semiconductor substrate 1 is then approximately 420 μm.

The variation in the doping concentration c (in cm$^{-3}$) which is produced along the section lines A—A and B—B shown in FIG. 1 is reproduced as a logarithmic plot as a function of the distance x from the substrate surface (see FIG. 1) in FIG. 7 (section A—A) and in FIG. 6 (section B—B). Here the doping concentration for n-doped material is plotted upwards from the broken zero line and the corresponding doping concentration for p-doped material downwards. It can be concluded from FIGS. 6 and 7 that, in this example, the n-type base layer 8 has, for example, a doping concentration of about $5 \times 10^{13}$ cm$^{-3}$, while the n-type emitter layer 6 has a doping concentration of about $10^{18}$ cm$^{-3}$, and the p-doped contact region 5 has a doping concentration of about $10^{19}$ cm$^{-3}$.

The device according to FIG. 1 can be interpreted in an equivalent circuit diagram (FIG. 5) as an antiparallel series circuit of a diode D and a thyristor T, it being possible for the diode D to be shorted by the first MOSFET M1, while the second MOSFET M2 is connected between the cathode K and the gate of the thyristor T.

The function of the device according to FIG. 1 is as follows: in the turned-on state (ON state), the first gate electrode G1 has a positive gate voltage relative to the cathode K. The first MOSFET M1 is consequently turned-on and short-circuits the cathode contact 2 to the n-type emitter layer 6, which acts as an emitter for the rest of the device. As a result of the short circuit, the active structure of the device reduces to a p-n-p-n sequence of four layers (p-type emitter layer 9, n-type base layer 8, p-type base layer 7 and n-type emitter layer 6) which, apart from the channel resistance of the first MOSFET, which can be made very small, behaves like a conventional thyristor. The second MOSFET M2 is turned off in this phase.

In order to now turn the device off, the gate voltage is reduced at the first gate electrode G1 so that the first MOSFET M1 goes over to the turned-off state. As a result, the IG-FiBS is converted from the four-layer structure to a five-layer (p-n-p-n-p) structure and turns off. It should be borne in mind that, as a result of the additional p-doped contact region 5, the electron injection from the cathode side in principle stops completely.

At the same time as the first MOSFET M1 turns off, the second MOSFET M2 is turned on and then absorbs the full turn-off current. This is necessary in order to prevent an avalanche breakdown at the p-n junction between the contact region 5 and the n-type emitter layer 6. Said p-n junction has, in fact, a rather low breakdown voltage (in the order of magnitude of 10–20 V), which is far below the turn-off capability of the entire device. An avalanche breakdown at this p-n junction would then prevent a turning-off of the device or at least would appreciably slow down the turning-off process.

Referring to the explanations of the current redistribution which have been given for the GTO and the MCT in the paper, mentioned in the introduction, by K. Lilja and H. Grüning, it is now easy to explain why the IG-FiBS according to the invention does not have any problems with a filamentation of the current: in a GTO or MCT, a small increase in the voltage at the p-type base layer (corresponds to the p-type base layer 7 in FIG. 1) during the turning-off process results in an exponential increase in the electron injection from the cathode K. As described in the paper cited, this necessarily entails a current redistribution and a current filamentation (unless the special condition $\beta_{eff} < \beta_{crit}$ obtains).

In the IG-FiBS, on the other hand, the cathode is formed by the p-doped contact region 5 during turning-off. For this reason, an electron injection is completely impossible. On the contrary, an increase in the voltage or in the current of the IG-FiBS structure during the turning-off results in a faster removal of the stored charge carriers, i.e. in a faster turn-off. The IG-FiBS is therefore self-stabilizing.

Figure 2:
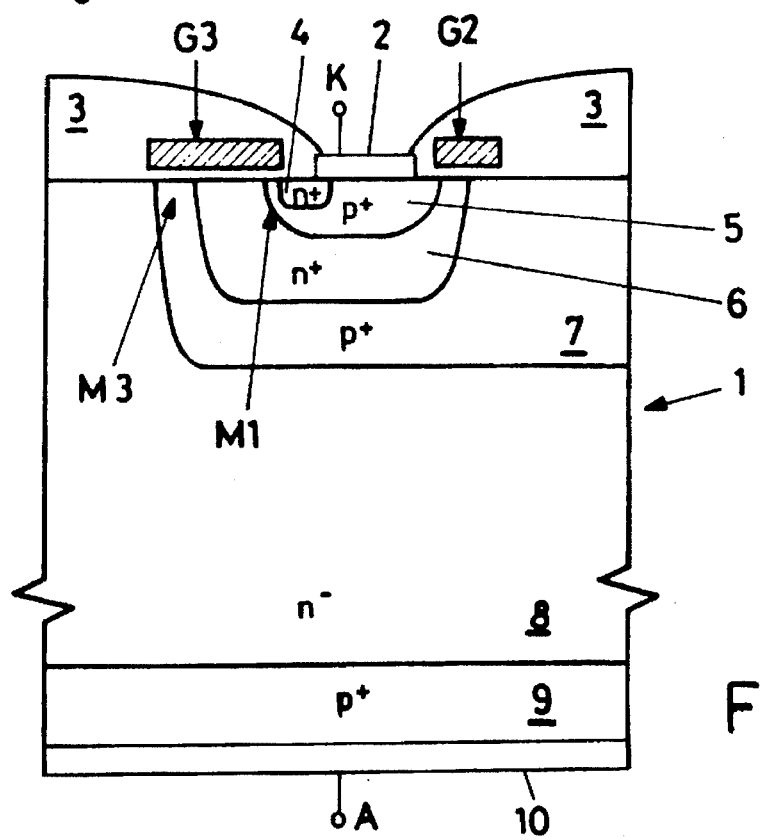

The structure shown in FIG. 1 comprises the two MOSFETs M1 and M2, which are both necessary—as explained above—for the turning-off process. A third MOSFET M3 (FIG. 2) can then be provided for turning on the device. Said third MOSFET M3 is formed by the n-type base layer 8, the p-type base layer 7, the n-type emitter layer 6 and a further gate electrode arranged in an insulated fashion above the p-type base layer 7. This further gate electrode may be combined, as shown in FIG. 2, with the first gate electrode G1 to form a common third gate electrode G3. The first and the third MOSFET M1 and M3 are integrated adjacently to one another in this way and electrically connected in series.

Figure 3:
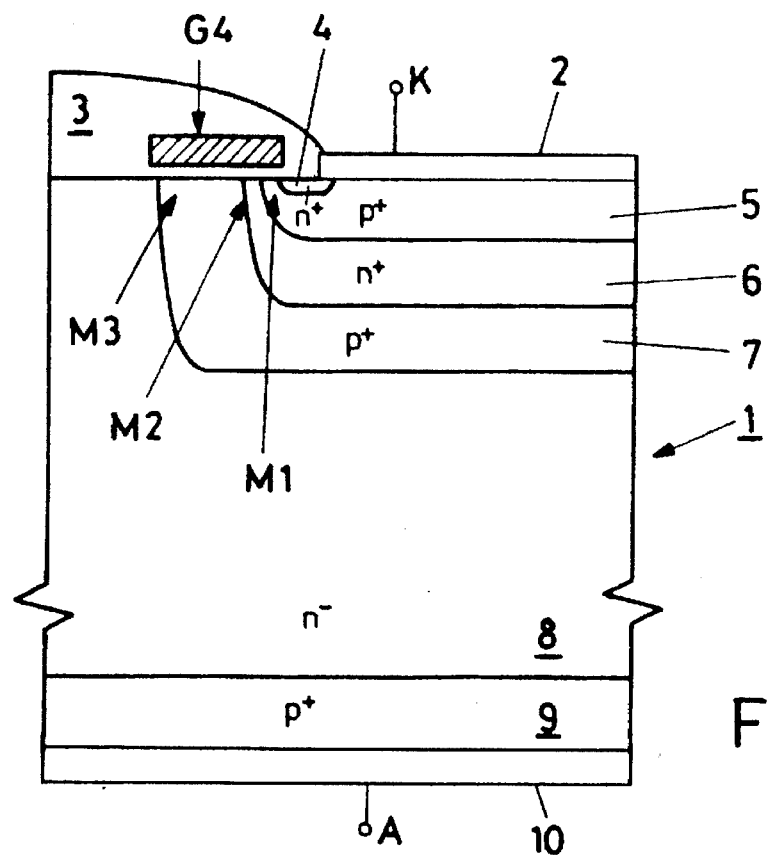
FIG. 3 shows the cross section of the unit cell of an embodiment which is comparable with FIG. 2 and in which all three MOSFETs are arranged adjacently on one side.

In a further embodiment (FIG. 3), the three MOSFETs M1, M2 and M3 are arranged adjacently on the same side and connected in series. The gate electrodes of the three MOSFETs are then combined to form a common fourth gate electrode G4.

At this point it should be pointed out that, within the scope of the invention, other arrangements and partitionings of the MOSFETs M1, M2 and M3 are also possible. Thus, it is conceivable, in particular, to arrange the first MOSFET M1 on one side of the cathode contact and to combine the MOSFETs M2 and M3 on the other side. It is also conceivable to provide other known means for turning on the device instead of the third MOSFET M3.

Figure 4:
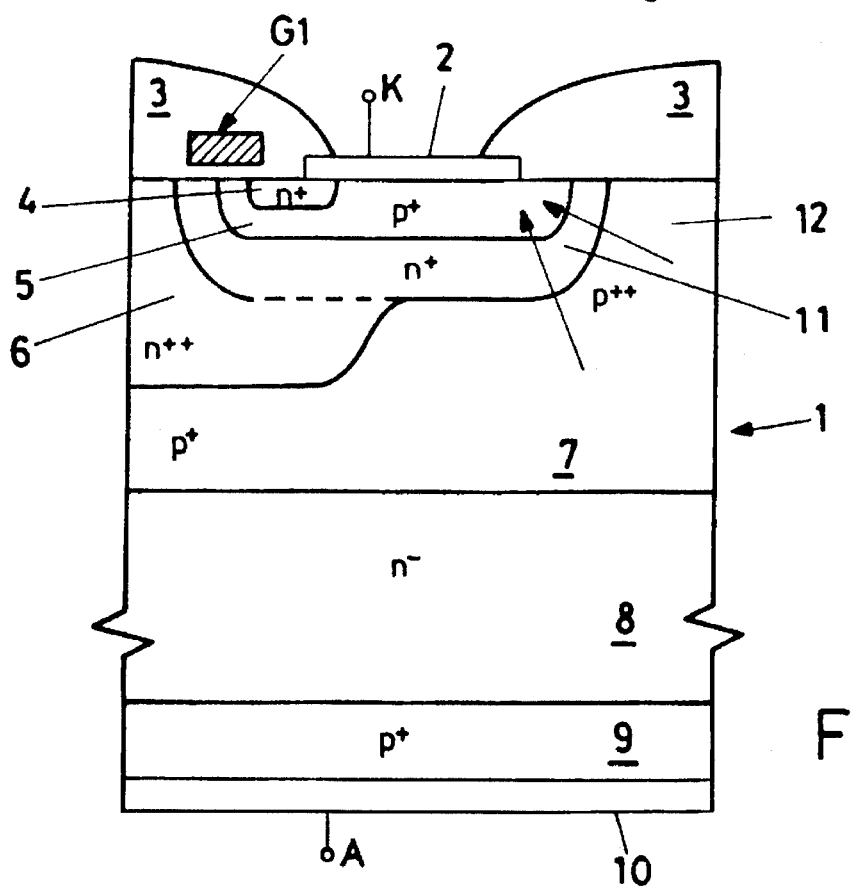
FIG. 4 shows the cross section of the unit cell of an embodiment which is comparable with FIG. 1 and in which the second MOSFET is replaced by a parasitic bipolar transistor.

A further embodiment shown in FIG. 4 shows a variant of the embodiment shown in FIG. 1. Instead of the second MOSFET M2, use is made here of a bipolar parasitic p-n-p transistor which is formed from contact region 5, n-type emitter layer 6 and p-type base layer 7 and which is triggered by an intended avalanche breakdown and then absorbs the turning-off current (indicated in FIG. 4 by the two arrows).

The intended breakdown takes place in the p-n junction between the contact region 5 and the n-type emitter layer 6. For this purpose, the n-type emitter layer 6 ends, towards the upper principle face of the semiconductor substrate 1, in a narrow, lightly doped (n+ instead of n++) base region 11 to which a more heavily doped (p++ instead of p+) subregion 12 of the p-type base layer 7 is adjacent. In this way, the bipolar transistor has a high current gain $\beta$ and can readily be turned on by a breakdown in this region. The other parts of the structure fulfil the same purposes as in the embodiment according to FIG. 1.

In the same way, a further MOSFET can also therefore be provided for turning on and can be combined with the first MOSFET M1, similar to FIG. 2.

Finally, a few more remarks should also be added in relation to the MOSFETs used:

The first MOSFET M1 is an n-channel MOSFET. It therefore has a channel resistance which is about three times lower than that of a corresponding p-channel MOSFET.

The second MOSFET M2 has the sole purpose of preventing an avalanche breakdown at the p-n junction from the contact region 5 to the n-type emitter layer 6. In order to ensure this, it has to carry the entire turning-off current during turning-off. This is, however, no problem since, unlike the MOSFET of an MCT, in which it is only 0.7 to 0.8 V, the driving voltage (source-drain voltage), may in this case be 10 V or more.

The IG-FiBS on the whole does not rely so much on a perfect technology as the MCT. If, for example, some of the first MOSFETs M1 do not function (are defective) in a large-area device, the associated unit cells cannot be turned on at all, i.e. they are automatically passivated. The IG-FiBS is therefore "self-repairing", at least as far as the MOSFETs M1 are concerned. On the other hand, the second MOSFETs M2 do not have to be serviceable in every unit cell. Since, however, their sole purpose is to prevent the avalanche breakdown, they do not necessarily have to be perfect everywhere. If, for example, the second MOSFET M2 is so designed that it carries the entire current with a source-drain voltage of 1 V, and the avalanche breakdown between the contact region 5 and the n-type emitter layer 6 takes place by design at a voltage of 15 V, there remains for the second MOSFET M2 a tolerance range of 1 to 15 V which can readily be maintained, even with a less demanding technology.

The previous embodiments have related to a device with p-n-p-n-p layer sequence, in which the individual layers and regions have a doping of a particular type. However, it is also within the scope of the invention to replace all the layers 6, 7, 8 and 9 and regions 4, 5 inside the semiconductor substrate 1 by corresponding layers and regions having complementary doping; the $p^+$-doped p-type emitter layer 9 is then converted into an $n^+$-doped n-type emitter layer, the n-doped n-type base layer 8 into a p-doped p-type base layer, etc.

All in all, the invention results in an easily drivable high-power device which can be reliably turned off, in which a filamentation of the current during turning-off is avoided and which can be produced in a comparatively simple manner.

Obviously, numerous modifications and variations of the present invention are possible in light of the above teachings. It is therefore to be understood that within the scope of the appended claims, the invention may be practiced otherwise than as specifically described herein.

What is claimed as New and Desired to be Secured by Letters Patent of the United States is:

1. Controlled turn-off power semiconductor device, comprising:
   (a) a multiplicity of adjacently arranged, electrically parallel-connected unit cells in a semiconductor substrate between an anode and a cathode;

(b) a layer sequence of a plurality of successive layers doped with alternating polarity within each unit cell between the anode and the cathode; and (c) within each unit cell, a first MOSFET which is arranged on the cathode side and which is provided for turning off the device;

wherein (d) the layer sequence comprises at least five layers, of which the first layer is formed as a $p^+$-doped p-type emitter layer, the second layer as an $n^-$-doped n-type base layer, the third layer as a $p^+$-doped p-type base layer, the fourth layer as an $n^+$-doped n-type emitter layer and the fifth layer as a $p^+$-doped contact region;

(e) the p-type emitter layer is arranged on the anode side and is contacted by an anode contact, and the contact region is arranged on the cathode side and is contacted by a cathode contact;

(f) the first MOSFET produces a switchable connection between the n-type emitter layer and the cathode contact and is formed from the n-type emitter layer, the contact region, an $n^+$-doped source region connected to the cathode contact and a first gate electrode arranged in an insulated fashion above the contact region; and (g) means are furthermore provided by which a conducting connection can be produced between the contact region and the p-type base layer during turning-off, wherein the means comprise a second MOSFET which is formed from the contact region, the n-type emitter layer, the p-type base layer and the second gate electrode arranged above the n-type emitter layer.

2. The device as claimed in claim 1, wherein (a) a third MOSFET for turning on the device is provided on the cathode side inside every unit cell; and (b) the third MOSFET produces a switchable connection between the n-type base layer and the n-type emitter layer and is formed from the n-type base layer, the p-type base layer, the n-type emitter layer and a gate electrode arranged above the n-type emitter layer.

3. The device as claimed in claim 2, wherein (a) the first MOSFET and the third MOSFET are adjacently arranged, and their gate electrodes are electrically in common; and (b) the first gate electrode and the gate electrode of the third MOSFET are combined to form a common third gate electrode.

4. The device as claimed in claim 3, wherein (a) the first MOSFET, the second MOSFET and the third MOSFET are adjacently arranged such that their gate electrodes are electrically common; and (b) the first gate electrode, the second gate electrode and the gate electrode of the third MOSFET are combined to form a common fourth gate electrode.

5. The device as claimed in claim 1, wherein (a) the n-type emitter layer comprises a first section having a first thickness and doping and a second section having a second thickness and doping, the first section being formed between the contact region and the p-type base layer and being thinner and less doped than the second section of the n-type emitter layer;

(b) the p-base layer having a third section of a third doping and a fourth section of a fourth doping, the third section being adjacent to said first section of the n-type emitter layer and being higher doped than the fourth section of the p-base layer;

(c) the contact region, said first section of the n-type emitter layer, and said third section of the p-base layer form a bipolar transistor which is used as means for producing the conducting connection between the contact region and the p-type base layer by being turned on by an avalanche breakdown between the contact region and the n-type emitter layer.

6. The device as claimed in claim 5, wherein (a) a further MOSFET for turning on the device is provided on the cathode side inside every unit cell; and (b) the further MOSFET produces a switchable connection between the n-type base layer and the n-type emitter layer and is formed from the n-type base layer, the p-type base layer, the n-type emitter layer and a gate electrode arranged above the n-type emitter layer.

7. The device as claimed in claim 6, wherein (a) the first MOSFET and the further MOSFET are adjacently arranged, and their gate electrodes are electrically in common; and (b) the first gate electrode and the gate electrode of the further MOSFET are combined to form a common gate electrode.

8. Controlled turn-off power semiconductor device, comprising:

(a) a multiplicity of adjacently arranged, electrically parallel-connected unit cells in a semiconductor substrate between an anode and a cathode;

(b) a layer sequence of a plurality of successive layers doped with alternating polarity within each unit cell between the anode and the cathode; and (c) within each unit cell, a first MOSFET which is arranged on the cathode side and which is provided for turning off the device;

wherein, (d) the layer sequence comprises at least five layers, of which the first layer is formed as a $n^+$-doped n-type emitter layer the second layer as an $p^-$-doped p-type base layer, the third layer as a $n^+$-doped n-type base layer, the fourth layer as an $p^+$-doped p-type emitter layer and the fifth layer as a $n^+$-doped contact region;

(e) the n-type emitter layer is arranged on the anode side and is contacted by an anode contact, and the contact region is arranged on the cathode side and is contacted by a cathode contact;

(f) the first MOSFET produces a switchable connection between the p-type emitter layer and the cathode contact and is formed from the p-type emitter layer, the contact region, an $p^+$-doped source region connected to the cathode contact and a first gate electrode arranged in an insulated fashion above the contact region; and (g) means are furthermore provided by which a conducting connection can be produced between the contact region and the n-type base layer during turning-off, wherein the means comprise a second MOSFET which is formed from the contact region, the p-type emitter layer, the n-type base layer and the second gate electrode arranged above the p-type emitter layer.

9. The device as claimed in claim 8, wherein (a) a third MOSFET for turning on the device is provided on the cathode side inside every unit cell; and (b) the third MOSFET produces a switchable connection between the p-type base layer and the p-type emitter layer and is formed from the p-type base layer, the n-type base layer, the p-type emitter layer and a gate electrode arranged above the p-type emitter layer.

10. The device as claimed in claim 9, wherein (a) the first MOSFET and the third MOSFET are adjacently arranged, and their gate electrodes are electrically in common; and (b) the first gate electrode (G1) and the gate electrode of the third MOSFET (M3) are combined to form a common third gate electrode (G3).

11. The device as claimed in claim 10, wherein
(a) the first MOSFET, the second MOSFET and the third MOSFET are adjacently arranged such that their gate electrodes are electrically in common; and
(b) the first gate electrode, the second gate electrode and the gate electrode of the third MOSFET are combined to form a common fourth gate electrode.

12. The device as claimed in claim 8, wherein
(a) the p-type emitter layer comprises a first section having a first thickness and doping and a second section having a second thickness and doping, the first section being formed between the contact region and the n-type base layer and being thinner and less doped than the second section of the p-type emitter layer;
(b) the n-base layer is having a third section of a third doping and a fourth section of a fourth doping, the third section being adjacent to said first section of the p-type emitter layer and being higher doped than the fourth section of the n-base layer;
(c) the contact region, said first section (11) of the p-type emitter layer, and said third section of the n-base layer form a bipolar transistor which is used as means for producing the conducting connection between the contact region and the n-type base layer by being turned on by an avalanche breakdown between the contact region and the p-type emitter layer.

13. The device as claimed in claim 12, wherein
(a) a further MOSFET for turning on the device is provided on the cathode side inside every unit cell; and
(b) the further MOSFET produces a switchable connection between the p-type base layer and the p-type emitter layer and is formed from the p-type base layer, the n-type base layer, the p-type emitter layer and a gate electrode arranged above the p-type emitter layer.

14. The device as claimed in claim 13, wherein
(a) the first MOSFET and the further MOSFET are adjacently arranged, and their gate electrodes are electrically in common; and
(b) the first gate electrode and the gate electrode of the further MOSFET are combined to form a common gate electrode.

* * * * *